(12) United States Patent
Kouchiyama et al.

(10) Patent No.: US 8,222,713 B2
(45) Date of Patent: Jul. 17, 2012

(54) STORAGE ELEMENT AND STORAGE APPARATUS

(75) Inventors: Akira Kouchiyama, Kanagawa (JP); Katsuhisa Aratani, Chiba (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 11/565,792

(22) Filed: Dec. 1, 2006

(65) Prior Publication Data

US 2007/0139987 A1    Jun. 21, 2007

(30) Foreign Application Priority Data

Dec. 2, 2005   (JP) ................ P2005-349788

(51) Int. Cl.
     *H01L 23/52*   (2006.01)
(52) U.S. Cl. ............. 257/529; 257/2; 257/E21.645; 438/656; 365/148
(58) Field of Classification Search ............. 257/2, 529, 257/530, E31.029, E21.645; 365/46, 148, 365/163; 438/656
See application file for complete search history.

(56) References Cited

U.S. PATENT DOCUMENTS

| | | | | |
|---|---|---|---|---|
| 4,965,656 | A * | 10/1990 | Koubuchi et al. | 257/742 |
| 5,585,300 | A * | 12/1996 | Summerfelt | 505/330 |
| 6,333,231 | B1 | 12/2001 | Takahashi et al. | 438/289 |
| 6,487,106 | B1 * | 11/2002 | Kozicki | 365/153 |
| 6,770,905 | B1 * | 8/2004 | Buynoski et al. | 257/40 |
| 7,129,133 | B1 * | 10/2006 | Avanzino et al. | 438/244 |
| 7,307,270 | B2 * | 12/2007 | Aratani et al. | 257/2 |
| 2002/0079487 | A1 * | 6/2002 | Ramanath et al. | 257/40 |
| 2003/0122175 | A1 * | 7/2003 | Buskirk | 257/310 |
| 2004/0149980 | A1 | 8/2004 | Campbell | |
| 2005/0146955 | A1 * | 7/2005 | Kajiyama | 365/202 |
| 2005/0226036 | A1 * | 10/2005 | Aratani et al. | 365/158 |
| 2005/0277055 | A1 * | 12/2005 | Kon | 430/270.1 |
| 2007/0274120 | A1 * | 11/2007 | Pinnow et al. | 365/148 |

FOREIGN PATENT DOCUMENTS

| | | |
|---|---|---|
| JP | 2001176818 A  * | 6/2001 |
| JP | 2002-536840 | 10/2002 |
| JP | 2004-288843 | 10/2004 |
| JP | 2004-349691 | 12/2004 |
| JP | 2005-197634 | 7/2005 |
| JP | 2005-521245 | 7/2005 |
| WO | 03/079463 | 9/2003 |
| WO | WO 03079463 A2 * | 9/2003 |

OTHER PUBLICATIONS

Liu et al., "Diffusion barrier performance of reactively sputtered Ta-W-N between Cu and Si", Microelectronic Engineering, 75, 2004, 309-315, available online Jun. 26, 2004.*

Japanese Office Action issued on Aug. 4, 2009, for corresponding Japanese Patent Application JP 2005-349788.

* cited by examiner

*Primary Examiner* — William F Kraig
(74) *Attorney, Agent, or Firm* — K&L Gates LLP

(57) ABSTRACT

A storage element and storage apparatus are provided. A storage element includes a storage layer disposed between two electrodes, and an ion source layer provided in contact with the storage layer and containing any element selected from the group consisting of Cu, Ag, and Zn, wherein the material of the electrode on the storage layer side, of the two electrodes, is composed of an amorphous tungsten alloy containing at least one element selected from the group consisting of Zr, Nb, Mo, and Ta, or an amorphous tantalum nitride. The storage element is capable of stably performing an information recording operation.

9 Claims, 3 Drawing Sheets

STORAGE ELEMENT AND STORAGE APPARATUS

CROSS REFERENCES TO RELATED APPLICATIONS

The present application claims priority to Japanese Patent Application JP 2005-349788 filed with the Japanese Patent Office on Dec. 2, 2005, the entire contents of which being incorporated herein by reference.

BACKGROUND

The present application relates to a storage element capable of recording information and to a storage apparatus using the storage elements.

In information apparatuses such as computers, high-operating-speed and high-density DRAMs are widely used as random access memories (RAMs).

However, the DRAM needs a complicated manufacturing process and are high in manufacturing cost, as compared with general logic circuit LSIs and signal processing LSIs used in electronic apparatuses.

In addition, the DRAM is a volatile memory which looses information when the power supply is turned OFF and, therefore, needs frequently the refreshing operation, i.e., the operation of reading the written information (data), amplifying it again, and writing it again.

In view of this, for example, the FeRAM (ferroelectric memory), the MRAM (magnetic storage element) and the like have been proposed as nonvolatile memories which do not lose information even when the power supply is turned OFF.

In the cases of these memories, the written information can be preserved for a long time, even without power supplied.

Besides, in the cases of these memories, the nonvolatile characteristic is considered to make it possible to eliminate the need for the refreshing operation and to reduce the power consumption accordingly.

However, in the above-mentioned nonvolatile memories, it becomes difficult to secure their characteristics as storage elements, attendant on the reduction in the size of the memory element constituting each memory cell.

Therefore, it is difficult to reduce the element down to the limit on a design rule basis or to the limit on a manufacturing process basis.

In view of this problem, a storage element has been proposed as a memory having a configuration suited to reductions in size.

This storage element has a construction where an ionic conductor containing a metal is sandwiched between two electrodes.

In addition, the metal contained in the ionic conductor is contained in either one of the two electrodes. This ensures that when a voltage is impressed between the two electrodes, the metal contained in one of the electrodes is diffused as ions into the ionic conductor, whereby an electrical property such as resistance and capacitance of the ionic conductor is varied.

By utilizing this characteristic, a memory device can be configured (refer to, for example, JP-A-2002-536840 and Nikkei Electronics 20.1.2003, p. 104).

Specifically, the ionic conductor is composed of a solid solution of a chalcogenide and a metal. To be more specific, the ionic conductor is composed of a material having Cu, Ag, or Zn dissolved in AsS, GeS, or GeSe, and either one of the two electrodes contains Cu, Ag, or Zn (refer to JP-A-2002-536840).

Furthermore, various nonvolatile memories using a crystalline oxide material have also been proposed. For example, there has been reported a memory based on a device having a structure in which a Cr-doped $SrZrO_3$ crystal material is sandwiched between a lower electrode formed from $SrRuO_3$ or Pt and an upper electrode formed from Au or Pt, and reversible resistance changes are caused by application of different-polarity voltages (refer to A. Beck et al., Appl. Phys. Lett., 77, (2000), p. 139). However, detailed principle and the like of this memory has not yet been elucidated.

However, both the above-mentioned storage element having Cu, Ag, or Zn contained in either of the upper and lower electrodes and including a GeS or GeSe amorphous chalcogenide material sandwiched between the electrodes and the above-mentioned storage element using a crystalline oxide material have a very high ON-OFF ratio of resistance, i.e., a very high ratio between the resistance in a high-low resistance state (ON resistance) and the resistance in a high-resistance state (OFF resistance), of not less than the order of $10^3$, for example.

When a short voltage pulse is impressed on a storage element thus having a very high ON-OFF ratio of resistance, the storage element may take an intermediate value of resistance.

When the storage element takes an intermediate resistance value, the margin in data discrimination at the time of reading would be lowered.

The problem of the intermediate resistance value is considered to be generated as follows. Since the thickness of the thin film to be varied in resistance, for example, a thin film of GeS, GeSe or the like is comparatively large (for example, 10 nm or more), the intensity of the electric field upon application of a voltage is comparatively weak, so that the atoms of Cu, Ag, Zn or the like expected to move as ions would not move between predetermined positions but be trapped in their course. In addition, since the thickness of the thin film to be varied in resistance is comparatively large, the operating speed of the storage element is slow.

Further, since the intensity (magnitude) of the electric fields at the times of recording and erasing operations are low, the energy level for the ionized atoms (the atoms are transferred from an ionic state to a nonionic stat after the recording process or erasing process) after the movement to restart moving is expected to be low. As a result, it is difficult to sufficiently secure the retention (preservation) characteristic necessary to work as a nonvolatile memory.

Therefore, in the above-mentioned storage element, the storage thin film in which to record information by use of a variation in resistance thereof is desirably formed by using a material having a sufficient withstand voltage even when having a small film thickness.

Furthermore, in the condition where the storage thin film is in the low-resistance state, a current with a comparatively high current density flows therethrough, and the storage thin film is brought to a comparatively high temperature due to the Joule heat. Therefore, it is desirable to use a high melting point material for the storage thin film.

In view of the foregoing, a configuration has previously been proposed in which a high-resistance variable resistance layer is formed by use of a thin film of one of various oxides, as a storage thin film (storage layer) for recording information by use of a variation in resistance, and a layer containing Cu, Ag, or Zn is disposed in contact with the storage thin film (storage layer).

With the oxide thin film used as the storage thin film, a sufficient resistance variation can be obtained even where the film thickness is small. Therefore, the above-mentioned problems can be dissolved by reducing the film thickness and increasing the intensity of the electric field.

In the storage element in which the storage thin film (storage layer) composed of a high-resistance variable resistance layer and the layer containing Cu, Ag, or Zn are formed in contact with each other, electrode layers are provided respectively on the upper and lower sides of the laminate of these layers so that a current can be passed in the storage element.

Meanwhile, in the case where amorphous WN (tungsten nitride) is used for the electrode layer on the side of the storage thin film (storage layer), there has been the problem that, when a high voltage is impressed on the storage element in the process for transition of the storage element from the low-resistance state to the high-resistance state (the so-called erasing process), it may be impossible to bring the storage element to a sufficiently high resistance.

This is considered to be a phenomenon generated by the diffusion of the constituent element(s) of the electrode layer into the storage thin film (storage layer) due to the application of the high voltage.

Since this phenomenon is generated, it becomes impossible to secure a sufficient margin of voltage in the erasing process, or to secure a sufficient margin of the thickness of the storage thin film (storage layer) in the manufacturing process.

Thus, there is a need to provide a storage element capable of operating stably in recording information, and a storage apparatus using the storage elements.

SUMMARY

According to an embodiment, there is provided a storage element including: a storage layer disposed between two electrodes; and an ion source layer provided in contact with the storage layer and containing any element selected from the group consisting of Cu, Ag, and Zn, wherein the material of the electrode on the storage layer side, of the two electrodes, is an amorphous tungsten alloy containing at least one element selected from the group consisting of Zr, Nb, Mo, and Ta, or an amorphous tantalum nitride.

According to another embodiment, there is provided a storage apparatus including: the storage element according to the one embodiment of the present invention; a wiring connected one of the two electrodes; and a wiring connected to the other of the two electrodes, wherein a multiplicity of the storage elements are arranged.

According to the above-mentioned configuration of the storage element of an embodiment, the storage layer is disposed between the two electrodes, and the ion source layer containing any element selected from the group consisting of Cu, Ag, and Zn is provided in contact with the storage layer. Therefore, information can be recorded by utilizing a variation in the resistance state of the storage layer.

Specifically, for example, when a voltage is impressed on the storage element by applying a positive potential to the Cu, Ag, or Zn-containing ion source layer itself or to the side of the electrode in contact with the ion source layer, Cu, Ag, or Zn (ion source element) contained in the ion source layer is ionized, the ions are diffused, and the metal ions are coupled with electrons at a portion on the other electrode side, with the result of deposition of the metal, or the metal ions remain in the storage layer to form an impurity level of an insulating film, whereby the resistance of the storage layer is lowered, and information can be thereby recorded.

Besides, when a negative voltage is impressed on the storage element by applying a negative potential to the Cu, Ag, or Zn-containing ion source layer or to the side of the one electrode in contact with the ion source layer, starting from this condition, the Cu, Ag, or Zn having deposited on the other electrode side is again ionized, and the metal ions return to the one electrode side, whereby the resistance of the storage layer is returned to an original high state, and the resistance of the storage element is also raised, so that the previously recorded information can thereby be erased.

The material of the electrode on the storage layer side, of the two electrodes, is the amorphous tungsten alloy containing at least one element selected from the group consisting of Zr, Nb, Mo, and Ta, or an amorphous tantalum nitride, whereby the phenomenon in which the diffusion of the constituent element(s) of the electrode material is generated when a high voltage is impressed during the process of transition of the storage element from a low-resistance state to a high-resistance state is restrained.

This makes it possible to achieve the transition of the resistance of the storage element to a sufficiently high resistance, and to stably record information in the storage layer.

According to the above-mentioned configuration of the storage apparatus of another embodiment, the storage apparatus includes the storage element according to the one embodiment of the invention, the wiring connected to one of the two electrodes, and the wiring connected to the other of the two electrode, wherein a multiplicity of the storage elements are arranged. This makes it possible to record and erase information by passing currents in the storage elements by way of the wirings.

According to an embodiment, it is possible to stably record information in the storage layer and, hence, to enhance the reliability of the storage element.

Further, since information recording is conducted by utilizing a variation in the resistance of the storage element, particularly a variation in the resistance of the storage layer, recording of information and retention of the recorded information can be easily achieved even in the case where the storage element is made more and more finer.

Therefore, according to an embodiment, a storage apparatus having high reliability can be configured.

In addition, it is possible to promise a rise in the degree of integration (a rise in the density) of the storage apparatus and a reduction in the size of the storage apparatus.

Additional features and advantages are described herein, and will be apparent from, the following Detailed Description and the figures.

DETAILED DESCRIPTION

Figure 1:
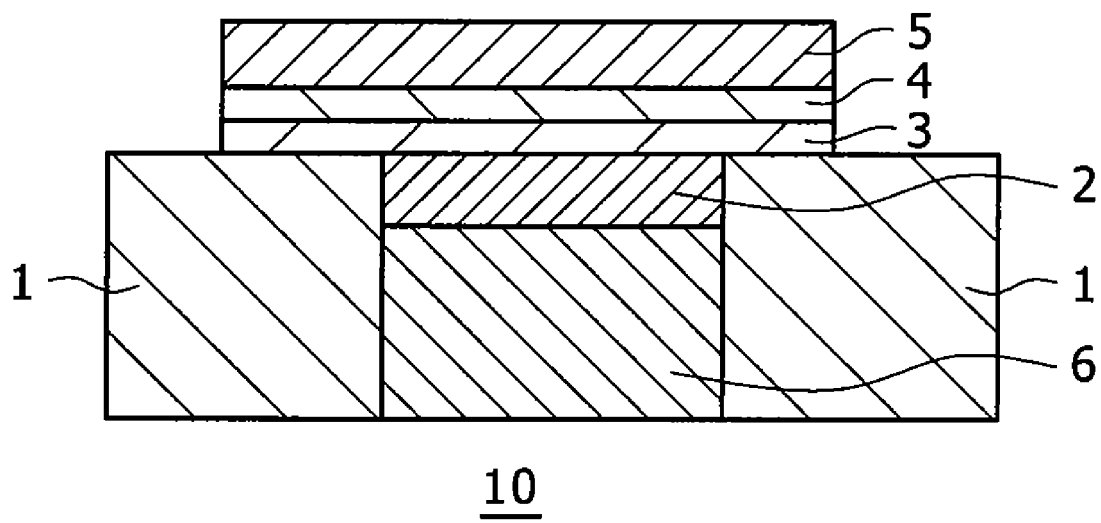
FIG. 1 is a schematic configuration diagram (sectional view) of a storage element according to an embodiment.

A schematic configuration diagram (sectional view) of a storage element is shown in FIG. 1 pursuant to an embodiment.

The storage element 10 has a configuration in which a storage thin film (storage layer) 3 having a comparatively high resistance is formed on a comparatively thick silicon oxide film 1, an ion source layer 4 containing any element selected from the group consisting of Cu, Ag, and Zn is formed on the storage thin film 3, and an upper electrode 5 is formed on the ion source layer 4.

In addition, a plug layer 6 and a lower electrode 2 are formed so as to penetrate a part of the silicon oxide film 1 beneath the storage thin film 3, and the lower electrode 2 is in contact with the lower side of the storage thin film 3.

For forming the storage thin film (storage layer) 3, for example, various oxides can be used.

Examples of the oxides include rare earth metal oxides such as gadolinium oxide, transition metal oxides such as tantalum oxide, and aluminum oxide and silicon oxide.

The ion source layer 4 may be configured by use of a film of CuTe, GeSbTe, CuGeTe, AgGeTe, AgTe, ZnTe, ZnGeTe, CuS, CuGeS, CuSe, CuGeSe or the like containing at least any one selected from the group consisting of Cu, Ag, and Zn and further containing at least any one selected from the calcogenide elements of Te, Se, and S, further with boron or a rare earth element and silicon being contained in the film.

Particularly, from the viewpoint of the configuration in which the portion variable in resistance is limited to the storage thin film (storage layer) 3 having a comparatively high resistance and a material having a resistance sufficiently lower than the high-resistance storage thin film 3 (for example, a resistance lower than the resistance in the ON state of the storage thin film 3) is provided, it is desirable to use Te as the chalcogenide element for the ion source layer 4, and to add thereto Cu, Ag, or Zn, which can move easily as cations; thus, it is desirable to form the ion source layer 3 from a material containing CuTe, AgTe, or ZnTe as a main constituent.

Furthermore, an ion source layer 4 containing CuTe and thus using Cu as an element to be cations is more desirable, since it is possible to lower the resistance of the ion source layer 4 so as to make the variation in the resistance of the ion source layer 4 sufficiently smaller than the variation in the resistance of the storage thin film (storage layer) 3, and to enhance the stability of the memory operation.

Where the ion source layer 4 is composed of a CuGeTe film, for example, it suffices for the film thickness to be 5 to 50 nm, for example.

The upper electrode 5 can be formed by use of a wiring material which is ordinarily used in a semiconductor process, for example, TiW, Ti, W, Cu, Al, Mo, Ta, WN, TaN, and silicides.

The plug layer 6 can be formed by using, for example, W (tungsten).

In the storage element 10 according to this embodiment, particularly, the lower electrode 2 in contact with the storage thin film (storage layer) 3 is formed by use of an amorphous tungsten alloy containing at least one element selected from the group consisting of Zr, Nb, Mo, and Ta, or an amorphous TaN (tantalum nitride).

This makes it possible to restrain the diffusion of the constituent element(s) of the lower electrode 2, even when a high voltage is impressed thereon.

Examples of the amorphous tungsten alloy containing at least one element selected from the group consisting of Zr, Nb, Mo, and Ta include WZrNb, WZrMo, and WZrTa.

The storage element 10 in this embodiment is capable of store information by operating as follows.

First, for example, a positive potential (+ potential) is applied to the ion source layer 4 containing Cu, Ag, or Zn, whereby a positive voltage is impressed on the storage element 10 so that the upper electrode 5 side will be positive in polarity. This ensures that Cu, Ag, or Zn in the ion source layer 4 is ionized, and the metal ions are diffused through the storage thin film 3 and coupled with electrons on the lower electrode 2 side, to be deposited as metal, or the metal ions remain in the state of having been diffused into the storage thin film 3.

Then, current paths containing a large amount of Cu, Ag, or Zn are formed inside the storage thin film 3, or a multiplicity of defects due to Cu, Ag, or Zn are formed inside the storage thin film 3, whereby the resistance of the storage thin film 3 is lowered. Each of the other layers than the storage thin film 3 is intrinsically low in resistance, as compared with the resistance before recording of the storage thin film 3; therefore, by lowering the resistance of the storage thin film 3, the overall resistance of the storage element 10 can also be lowered.

Thereafter, the positive voltage is removed so as to eliminate the voltage impressed on the storage element 10, whereon the storage element 10 is maintained in a lowered-resistance state. It is thereby possible to achieve recording (writing) of information (recording process).

On the other hand, for example, a negative potential (− potential) is applied to the Cu, Ag, or Zn-containing ion source layer 4, whereby a negative voltage is impressed on the storage element 10 so that the upper electrode 5 side will be negative in polarity. This ensures that the Cu, Ag, or Zn constituting the current paths or the impurity level having been formed inside the storage thin film 3 is ionized, and the metal ions are moved through the storage thin film 3, returning to the ion source layer 4 side.

As a result, the current paths or defects due to Cu, Ag, or Zn inside the storage thin film 3 disappear, whereby the resistance of the storage thin film 3 is raised. Since the other layers than the storage thin film 3 are intrinsically low in resistance, it is possible by raising the resistance of the storage thin film 3 to raise the overall resistance of the storage element 10.

Thereafter, the negative voltage is removed so as to eliminate the voltage impressed on the storage element 10, whereon the storage element 10 is maintained in a raised-resistance state. By this it is possible to achieve erasure of the recorded information (erasing process).

By repeating these processes, recording (writing) of information into the storage element 10 and erasure of the recorded information can be carried out repeatedly.

In addition, particularly, the element selected from the group consisting of Te, S, and Se, namely, the chalcogen element is contained in the ion source layer 4 in addition to the above-mentioned metallic element (Cu, Ag, or Zn), whereby the metallic element (Cu, Ag, or Zn) and the chalcogen element (Te, S, or Se) in the ion source layer 4 are coupled with each other, to form a metal chalcogenide layer. The metal chalcogenide layer mainly has an amorphous structure. When a positive potential, for example, is impressed on the side of the upper electrode 5 in contact with the ion source layer 4 composed of the metal chalcogenide, the metallic element (Cu, Ag, or Zn) contained in the metal chalcogenide layer is ionized, the metal ions are diffused into the high-resistance storage thin film 3 and coupled with electrons at a portion on the lower electrode 2 side, to be deposited, or the metal ions remain in the storage thin film 3 to form an impurity level of an insulating film, whereby the resistance of the storage thin film 3 is lowered, and information can be thereby recorded.

When a negative potential is impressed on the side of the upper electrode 5 in contact with the ion source layer 4 composed of the metal chalcogenide layer, starting from the just-mentioned condition, the metallic element (Cu, Ag, or Zn)

having deposited on the lower electrode 2 side is again ionized, and the metal ions return into the metal chalcogenide layer. As a result, the resistance of the storage thin film 3 is returned to the original high resistance, and the overall resistance of the storage element 10 is also raised, whereby erasure of the recorded information can be achieved.

Then, where the high-resistance state is made to correspond to information (data) of "0", for example, and the low-resistance state to information of "1", it is possible to change from "0" to "1" in the information recording process by application of a positive voltage, and to change from "1" to "0" in the information erasing process by application of a negative voltage.

Incidentally, while the initial state before recording of the storage thin film 3 is generally a high-resistance state, the storage thin film 3 may be made to initially assume a low-resistance state, or record-holding state, by a plasma treatment, an annealing treatment or the like in the processing steps thereof.

The resistance after recording depends rather on the recording conditions such as the width of a voltage pulse or current pulse applied at the time of recording, the current, etc. than on the cell size of the storage element 10 and the material composition of the storage thin film. Where the initial resistance is not less than 100 kΩ, the resistance after recording is in the range of about 50Ω to 50 kΩ.

For demodulating the recorded data, it suffices that the ratio of the initial resistance to the resistance after recording is not less than about two. Therefore, there can be adopted a condition where the resistance before recording is 100Ω and the resistance after recording is 50Ω, or a condition where the resistance before recording is 100 kΩ and the resistance after recording is 50 kΩ; thus, the initial resistance of the storage thin film 3 is so set as to satisfy such a condition. The resistance of the storage thin film 3 can be controlled, for example, by the oxygen concentration, the film thickness, the area and, further, addition of impurity material(s).

According to the configuration of the storage element 10 in this embodiment as above-described, the storage thin film 3 and the ion source layer 4 are sandwiched between the lower electrode 2 and the upper electrode 5. This configuration ensures that when a positive voltage (+ potential), for example, is applied to the ion source layer 4 side so that the upper electrode 5 side will be positive in polarity, current paths containing a large amount of Cu, Ag, or Zn are formed in the storage thin film 3, or a multiplicity of defects due to Cu, Ag, or Zn are formed in the storage thin film 3, whereby the resistance of the storage thin film 3 is lowered, and the overall resistance of the storage element 10 is lowered. Then, by stopping the application of the positive voltage so that no voltage is applied to the storage element 10, the lowered-resistance state is maintained; thus, recording of information is achieved.

Besides, a negative voltage (− potential), for example, is applied to the ion source layer 4 in the storage element 10 in the state after recording so that the upper electrode 5 side will be negative in polarity. This ensures that the current paths or defects having been formed inside the storage thin film 3 due to Cu, Ag, or Zn disappear, whereby the resistance of the storage thin film 3 is raised, and the overall resistance of the storage element 10 is raised. Then, by stopping the application of the negative voltage so that no voltage is applied to the storage element 10, the raised-resistance state is maintained; thus, erasure of the previously recorded information can be achieved.

In addition, since information is recorded by utilizing a variation in the resistance of the storage element 10, particularly a variation in the resistance of the storage thin film 3, recording of information and retention of recorded information can be carried out easily, even when the storage element 10 is made more and more finer.

Besides, according to the storage element 10 in this embodiment, the amorphous tungsten alloy containing at least one element selected from the group consisting of Zr, Nb, Mo, and Ta or the amorphous TaN (tantalum nitride) is used for the lower electrode 2. This ensures that the phenomenon of diffusion of the constituent element(s) of the material of the lower electrode 2 into the storage thin film (storage layer) 3 is restrained from occurring, even when a high voltage is applied in the erasing process for transition of the storage element 10 from the low-resistance state to the high-resistance state.

As a result, it is possible to cause transition of the resistance of the storage element 10 to a sufficiently high resistance in the erasing process, and to stably record information in the storage layer 3.

Since information can thus be stably recorded in the storage layer 3 of the storage element 10, the reliability of the storage element 10 can be enhanced.

Therefore, a storage apparatus having high reliability can be configured.

In addition, according to the storage element 10 in this embodiment, every one of the lower electrode 2, the storage thin film 3, the ion source layer 4, and the upper electrode 5 can be composed by use of a material which can be sputtered. For example, it suffices to conduct sputtering by use of a target having a composition suited to the material of the relevant layer.

Besides, it is possible to continuously form the layers, by replacing the target in the same sputtering apparatus.

A storage apparatus (memory) can be configured by arranging a multiplicity of the storage elements according to the above-described embodiment in, for example, a row or a matrix.

It suffices that for each of the storage elements 10, a wiring connected to the lower electrode 2 side and a wiring connected to the upper electrode 5 side are provided, and, for example, the storage elements 10 are arranged near intersections of the wirings.

Specifically, for example, each of the lower electrodes 2 is formed in common for memory cells arrayed in the line direction, and each of the wirings connected to the upper electrodes 5 is formed in common for memory cells arrayed in the column direction. By selecting the lower electrodes 2 and the wirings through which to pass a current by applying a potential, the memory cells for recording are selected, and a current is passed in each of the storage elements 10 of the memory cells selected, whereby recording of information and erasure of recorded information can be carried out.

The storage element 10 in the above-described embodiment is capable of recording information and reading of information easily and stably, and, particularly, has excellent characteristics as to data retention stability under high-temperature environments and for a long time.

In addition, the storage element 10 in the above-described embodiment promises easy recording of information and easy retention (preservation) of recorded information, even when it is progressively reduced in size.

Therefore, by configuring a storage apparatus by use of the storage elements 10 according to the above embodiment, it is possible to contrive an enhancement of the degree of integration (enhancement of density) and a reduction in the size of the storage apparatus.

Besides, since the storage thin film 3 is formed on the lower electrode 2 composed of an amorphous material in the storage element 10 in this embodiment, the surface properties of the lower electrode 2 formed of the amorphous material are uniform. This makes it possible to improve the film uniformity of the storage thin film 3, and to form a memory cell array in which the storage elements 10 of the memory cells are evenly distributed in characteristics.

Incidentally, while the ion source layer 4 and the upper electrode 5 are formed respectively from different materials in the storage element 10 according to the above-described embodiment, the electrode layer may be made to function also as the ion source layer, by making the electrode contain the element to be the ion source (Cu, Ag, or Zn).

Further, in the storage element 10 in the above-described embodiment, the storage thin film (storage layer) 3 and/or the ion source layer 4 may be used in common for a plurality of memory cells adjacent to each other. For example, the storage thin film 3 and/or the ion source layer 4 can be used in common for a plurality of memory cells, memory cells in a part of lines or a part of columns, the whole of memory cells, or the like.

Such a configuration ensures that the accuracy of patterning is moderated for the layer used in common, so that the patterning can be carried out easily. Therefore, it is possible to largely enhance the yield of manufacture, and to manufacture the storage elements easily and in a high yield, even when the memory cell size is reduced.

Furthermore, while the ion source layer 4 is laminated on the storage thin film 3 in the storage element 10 according to the above-described embodiment, the order of lamination may be reversed; namely, the storage thin film may be laminated on the ion source layer.

In the case of such a configuration, it suffices to use the amorphous tungsten alloy having at least one element selected from the group consisting of Zr, Nb, Mo, and Ta or the amorphous TaN (tantalum nitride), for the electrode provided in contact with the storage thin film, i.e., the upper electrode on the storage thin film. This makes it possible to restrain the diffusion of the constituent element(s) of the upper electrode upon application of a high electric field.

EXPERIMENT 1

A silicon oxide film 1 was provided with a through-hole of 0.28 μm in diameter, and a plug layer 6 of tungsten was formed so as to fill a part of the depth of the through-hole.

A film to be a lower electrode 2 was formed on the plug layer 6 by sputtering, followed by a so-called etch-back treatment, to form the lower electrode 2 in the through-hole in the silicon oxide film 1.

Next, metallic gadolinium was formed in a thickness of 0.8 to 1.5 nm on the silicon oxide film 1 and the lower electrode 2 by sputtering, and, in the same vacuum apparatus, an oxidizing treatment was conducted by use of a plasma as an oxygen atmosphere, to form a storage thin film (storage layer) 3 composed of a gadolinium oxide film.

Next, a CuTeGe film as an ion source layer 4 was formed on the storage layer 3 by sputtering. Subsequently, a tungsten film was formed as an upper electrode 5.

Thereafter, the assembly was taken out into the air, and was subjected to etching for patterning in a wide memory configuration unit size, so-called MAT, by lithography.

Next, a laminate film of tungsten film/aluminum film was formed as a wiring at an upper portion by sputtering, and patterning of the wiring was carried out.

Thereafter, a heat treatment at 160° C. was conducted in vacuum, to produce a storage element 10 having the structure shown in FIG. 1.

The storage elements 10 of memory cells were connected in series to respective selection transistors, to configure a memory (storage apparatus).

As an Example, memory samples were produced by use of WZrNb for the lower electrode 2 of the storage element 10.

In addition, as one Comparative Example, memory samples were produced by use of W for the lower electrode 2 of the storage element 10. In this Comparative Example, since the lower electrode 2 and the plug layer 6 were formed of the same material (tungsten W), these were collectively formed as a single W layer.

Further, as another Comparative Example, memory samples were produced by use of WN for the lower electrode 2 of the storage element 10.

Incidentally, in the samples using WZrNb for the lower electrode 2 and the samples using WN for the lower electrode 2, the storage element 10 in each memory cell of the memory had a configuration in which the position of the top surface of the plug layer 6 was recessed by 20 to 50 nm relative to the top surface of the surrounding silicon oxide film.

With a gate voltage impressed on the selection transistors, and voltage pulses were impressed between the upper electrodes 5 of the storage elements 10 and bit lines of the selection transistors, to carry out recording and erasure according to the polarity of the voltage pulses.

The recording conditions were a voltage pulse width of 1 ms, a recording voltage of 2.5 V, and a recording current of 150 μA. On the other hand, the erasing conditions were a voltage pulse width of 1 ms, and an erasing voltage of 1.5 V.

For each set of the memory samples, the resistance RW after recording (writing) and the resistance RE after erasure, of the storage elements 10 of the memory cells, were measured. Incidentally, the measured resistance value includes a resistance portion of the selection transistor, and, due to the problem of measurement accuracy, the upper limit of the resistance RE after erasure was about 20 MΩ.

Figure 2A:
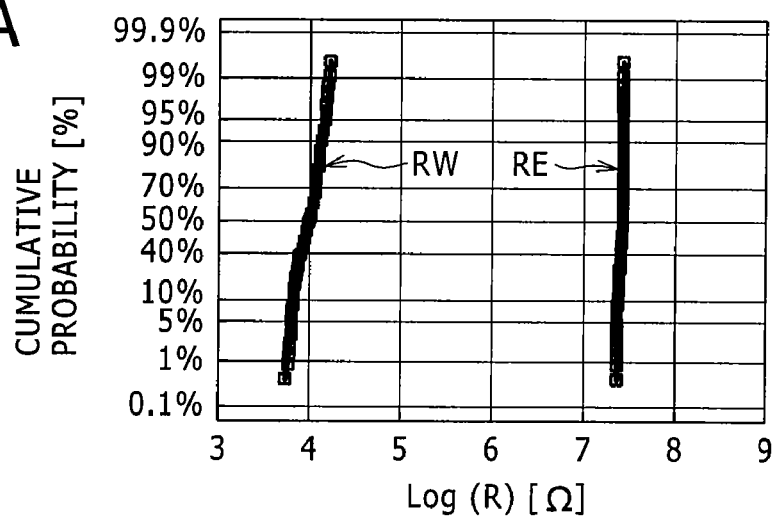
FIGS. 2A to 2C are diagrams each showing the cell distributions of the resistance after recording and the resistance after erasure.
Figure 2B:
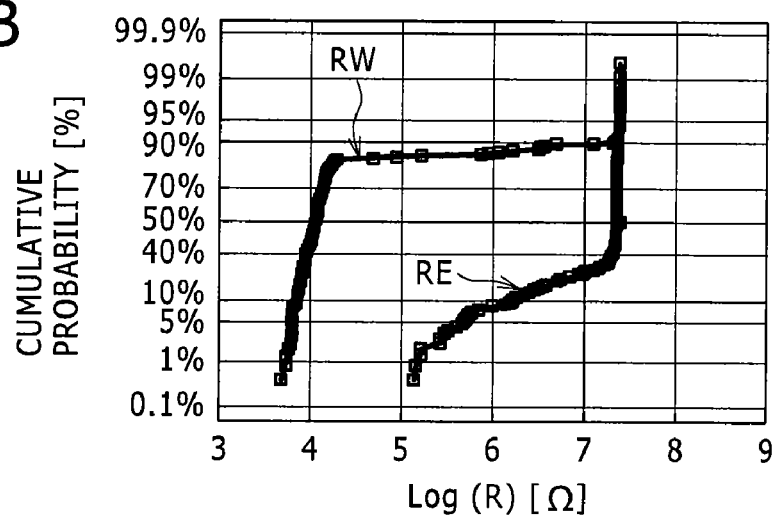
Figure 2C:
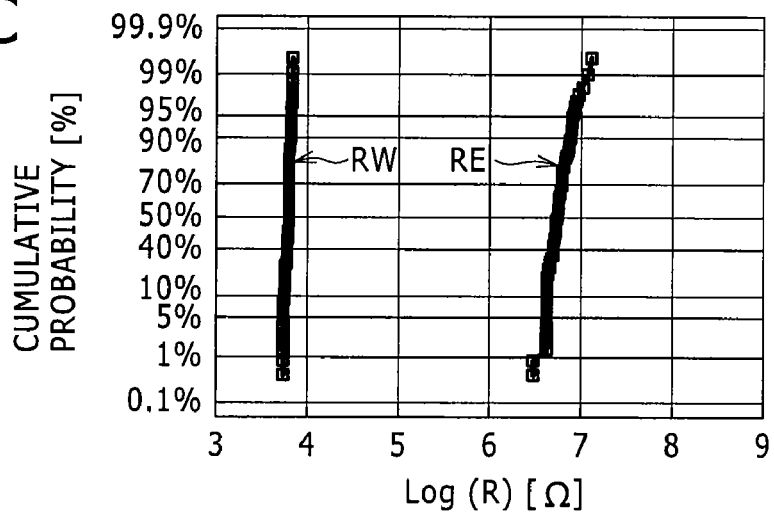

The respective cell distributions of the resistance RW after recording and the resistance RE after erasure are shown in FIGS. 2A to 2C on a sample kind basis. FIG. 2A shows the case where WZRNb was used for the lower electrode 2, FIG. 2B shows the case where W was used for the lower electrode 2, and FIG. 2C shows the case where WN was used for the lower electrode 2. In FIGS. 2A to 2C, the axis of abscissas represents the logarithm (the value of n in $10^n$) of resistance, and the axis of ordinates represents the cumulative probability (%) of the resistance.

It is seen from FIGS. 2A and 2C that both the resistance RW after recording and the resistance RE after erasure were evenly distributed, in the cases where the amorphous WZrNb film and the amorphous WN film were used respectively.

On the other hand, as seen from FIG. 2B, the resistance RW after recording was high in part (about 10%) of the storage elements, in the case where the W film was used.

Therefore, the use of an amorphous film of a W compound ensures that the resistance values after recording and after erasure are evenly distributed, so that recording and erasure can be stably carried out without fail.

EXPERIMENT 2

By the same manufacturing method as in Experiment 1, samples of the storage element 10 having the structure shown in FIG. 1 were produced.

As one Example, samples of the storage element 10 in which the lower electrode 2 was composed of an amorphous WZrNb film were produced.

In addition, as a Comparative Example, samples of the storage element 10 in which the lower electrode 2 was composed of an amorphous WN film were produced.

Further, as another Example, samples of the storage element 10 in which the lower electrode 2 was composed of an amorphous TaN film were produced.

For each set of the storage elements in Examples and Comparative Example, respective I-V characteristics were measured.

Figure 3A:
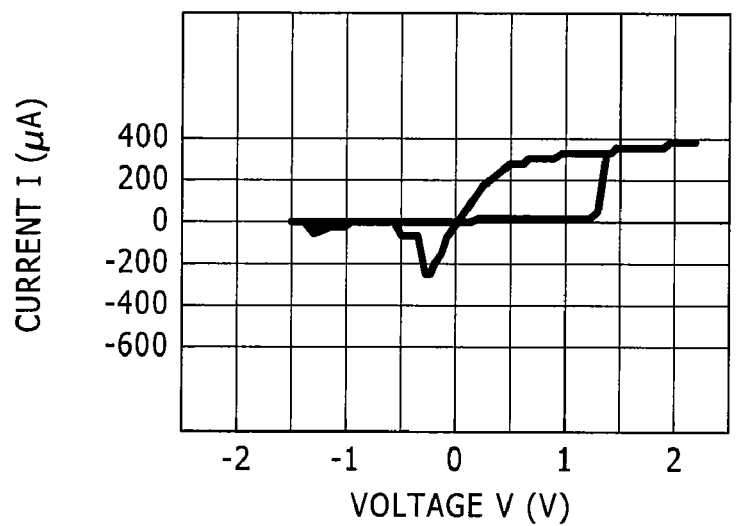
FIG. 3A is a diagram showing the I-V characteristic of the storage element in the case where the lower electrode is composed of a WZrNb film.
Figure 3B:
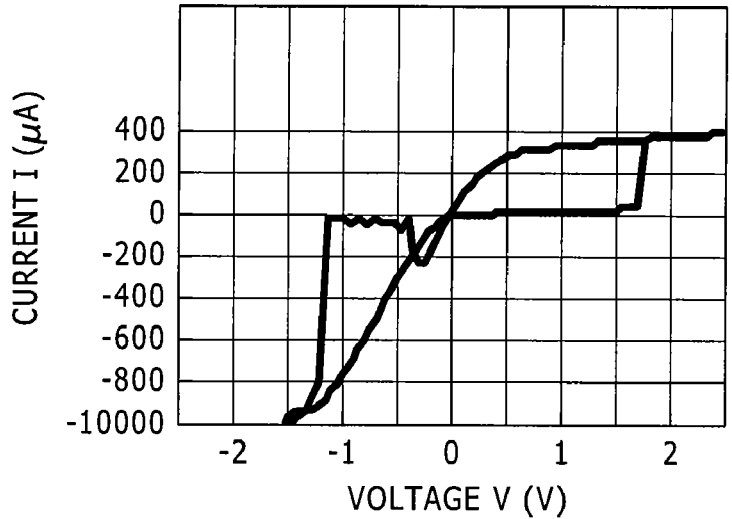
FIG. 3B is a diagram showing the I-V characteristic of the storage element in the case where the lower electrode is composed of a WN film.
Figure 4:
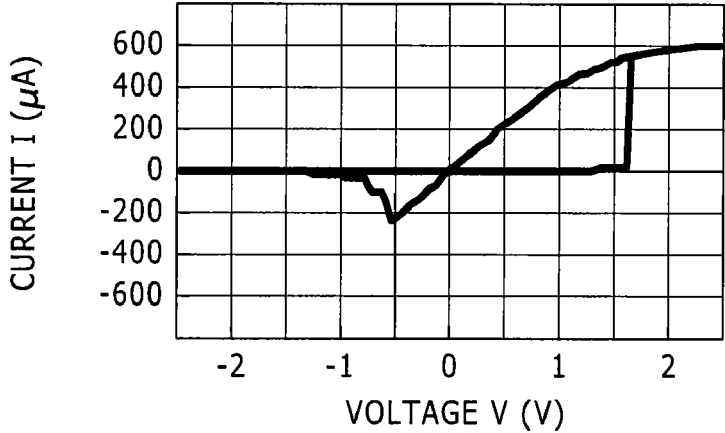
FIG. 4 is a diagram showing the I-V characteristic of the storage element in the case where the lower electrode is composed of a TaN film.

The measurement results are shown in FIGS. 3A, 3B and 4. FIG. 3A shows the case where the lower electrode 2 was composed of the WZrNb film, FIG. 3B shows the case where the lower electrode 2 was composed of the WN film, and FIG. 4 shows the case where the lower electrode 2 was composed of the TaN film.

Incidentally, the recording current was 400 µA in FIGS. 3A and 3B, but it was 600 µA in FIG. 4.

From FIG. 3B it is seen that where the lower electrode 2 was the WN film, a transition from a high-resistance state to a low-resistance state occurred at a voltage of about 1.2 V at the time of erasure, indicating the generation of a difficulty recoverable dielectric breakdown.

This is considered to be a failure generated due to the diffusion of W, a constituent element of WN used for the lower electrode 2, into the storage thin film (storage layer) 3.

On the other hand, it is seen from FIG. 3A that no failure was generated in the case where the lower electrode 2 was composed of the WZrNb film. The reason for this result is considered to reside in the fact that, since WZrNb is a metallic amorphous alloy and its constituent elements are not ionized, diffusion of metal ions is not liable to occur even upon application of a high electric field.

In addition, it is seen from FIG. 4 that in the case where the lower electrode 2 was composed of a nitride, like in FIG. 3B, but where the nitride was the TaN film containing Ta as a main element, diffusion of metal ions was not liable to occur, and no failure was generated.

As understood from the above results, with the amorphous W alloy or amorphous TaN used for the lower electrode 2 provided in contact with the storage layer, the diffusion of the constituent element(s) of the lower electrode 2 upon application of a high electric field in the erasing process can be restrained, and a transition to a sufficiently high resistance state can be achieved.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
a silicon oxide film having a through-hole provided therein;
a plug layer of tungsten occupying a part of the through-hole;
a first electrode formed on top of the plug layer such that the first electrode and the plug layer fill the entirety of the through-hole;
a storage layer positioned outside the through-hole and disposed between the first electrode and a second electrode, the storage layer formed on the first electrode and on at least a portion of the silicon oxide film; and
an ion source layer provided between said storage layer and the first electrode and containing an element selected from the group consisting of Cu, Ag, and Zn, wherein
the material of the second electrode that contacts the storage layer, of said two electrodes, is an amorphous tungsten alloy containing at least one element selected from the group consisting of Zr, Nb and Mo,
wherein a low resistance state is recordable in the storage element by applying a first voltage or a first current pulse between the first electrode and the second electrode to form a conduction path containing at least one of elements selected from Cu, Ag, Zn in the storage layer, and
wherein a high resistance state is recordable in the storage element by applying a second voltage or a second current pulse opposite in polarity to the first voltage or the first current pulse between the first electrode and the second electrode to eliminate the conduction path formed in the storage layer.

2. The storage element as set forth in claim 1, wherein said ion source layer contains an element selected from the group consisting of Te, S, and Se.

3. The storage element as set forth in claim 2, wherein the ion source layer further includes boron or a rare earth element, and silicon.

4. The storage element as set forth in claim 1, wherein said ion source layer contains CuTe.

5. The storage element as set forth in claim 1, wherein the material of the second electrode is an amorphous tungsten alloy containing Zr and Nb.

6. The storage element as set forth in claim 1, wherein the storage layer is formed to cover the second electrode and portions of the silicon oxide film.

7. A storage apparatus comprising:
a storage element including a silicon oxide film having a through-hole provided therein, a plug layer of tungsten occupying a part of the through-hole, a first electrode formed on top of the plug layer such that the first electrode and the plug layer fill the entirety of the through-hole, a storage layer disposed between the first electrode and a second electrode, the storage layer positioned outside the through-hole and formed on the first electrode and on at least a portion of the silicon oxide film, and an ion source layer provided between said storage layer and the first electrode and containing an element selected from the group consisting of Cu, Ag, and Zn, with the material of the second electrode that contacts the storage layer, of said two electrodes, being an amorphous tungsten alloy containing at least one element selected from the group consisting of Zr, Nb and Mo;
a wiring connected to one of said two electrodes; and
a wiring connected to the other of said two electrodes, wherein
a multiplicity of said storage elements are arranged,
wherein a low resistance state is recordable in the storage element by applying a first voltage or a first current pulse between the first electrode and the second electrode to form a conduction path containing at least one of elements selected from Cu, Ag, Zn in the storage layer, and
wherein a high resistance state is recordable in the storage element by applying a second voltage or a second current pulse opposite in polarity to the first voltage or the first current pulse between the first electrode and the second electrode to eliminate the conduction path formed in the storage layer.

8. The storage apparatus as set forth in claim 7, wherein the material of the second electrode is an amorphous tungsten alloy containing Zr and Nb.

9. A storage element comprising:
- a silicon oxide film having a through-hole provided therein;
- a plug layer of tungsten occupying a part of the through-hole;
- a first electrode formed on top of the plug layer such that the first electrode and the plug layer fill the entirety of the through-hole;
- a storage layer positioned outside the through-hole and disposed between the first electrode and a second electrode, the storage layer formed on the first electrode and on at least a portion of the silicon oxide film; and
- an ion source layer provided between said storage layer and the first electrode and containing an element selected from the group consisting of Cu, Ag, and Zn,
- wherein the material of the second electrode that contacts the storage layer, of said two electrodes, is an amorphous tantalum nitride,
- wherein a low resistance state is recordable in the storage element by applying a first voltage or a first current pulse between the first electrode and the second electrode to form a conduction path containing at least one of elements selected from Cu, Ag, Zn in the storage layer, and
- wherein a high resistance state is recordable in the storage element by applying a second voltage or a second current pulse opposite in polarity to the first voltage or the first current pulse between the first electrode and the second electrode to eliminate the conduction path formed in the storage layer.

* * * * *